United States Patent
Tsai et al.

(10) Patent No.: US 7,012,281 B2
(45) Date of Patent: Mar. 14, 2006

(54) LIGHT EMITTING DIODE DEVICE AND MANUFACTURING METHOD

(75) Inventors: Tzong-Liang Tsai, Hsinchu (TW); Chih-Sung Chang, Hsinchu (TW); Chih-Li Chiang, Tai Chung (TW); Tzer-Perng Chen, Hsinchu (TW)

(73) Assignee: Epistar Corporation, Hsinchu (TW)

(*) Notice: Subject to any disclaimer, the term of this patent is extended or adjusted under 35 U.S.C. 154(b) by 0 days.

(21) Appl. No.: 10/695,807

(22) Filed: Oct. 30, 2003

(65) Prior Publication Data
US 2005/0093002 A1 May 5, 2005

(51) Int. Cl.
*H01L 33/00* (2006.01)
*H01L 21/00* (2006.01)

(52) U.S. Cl. .................. 257/99; 257/98; 438/22

(58) Field of Classification Search ............. 257/79, 257/95, 96, 98, 99, 103; 438/22, 29
See application file for complete search history.

(56) References Cited

U.S. PATENT DOCUMENTS

| | | | | |
|---|---|---|---|---|
| 6,107,644 A | * | 8/2000 | Shakuda et al. | 257/79 |
| 6,291,839 B1 | * | 9/2001 | Lester | 257/91 |
| 6,445,007 B1 | * | 9/2002 | Wu et al. | 257/80 |
| 6,835,958 B1 | * | 12/2004 | Uemura | 257/79 |

* cited by examiner

*Primary Examiner*—Mark V. Prenty
(74) *Attorney, Agent, or Firm*—Winston Hsu (57) ABSTRACT

A light emitting diode device and method of manufacturing comprises a light-transmission conductive layer and a patterned transparent conductive layer. In accordance with the present invention, the light-transmission conductive layer and the patterned transparent conductive layer is spread optimal area above the LED device so as to enhance the transparency and ohmic property of LED device.

10 Claims, 9 Drawing Sheets

FIG. 5

LIGHT EMITTING DIODE DEVICE AND MANUFACTURING METHOD

BACKGROUND OF THE INVENTION

1. Field of the Invention

The present invention relates to a light-emitting diode device and method of manufacturing the same, and more particularly to the light emitting diode (LED) device including a light-transmission conductive layer with high transparency and a patterned transparent conductive layers. The LED device of present invention includes the light-transmission conductive layer with high transparency and the patterned transparent conductive layers so as to improve transmission efficiency, ohmic conductivity and light brightness.

2. Description of Related Art

Figure 1A:
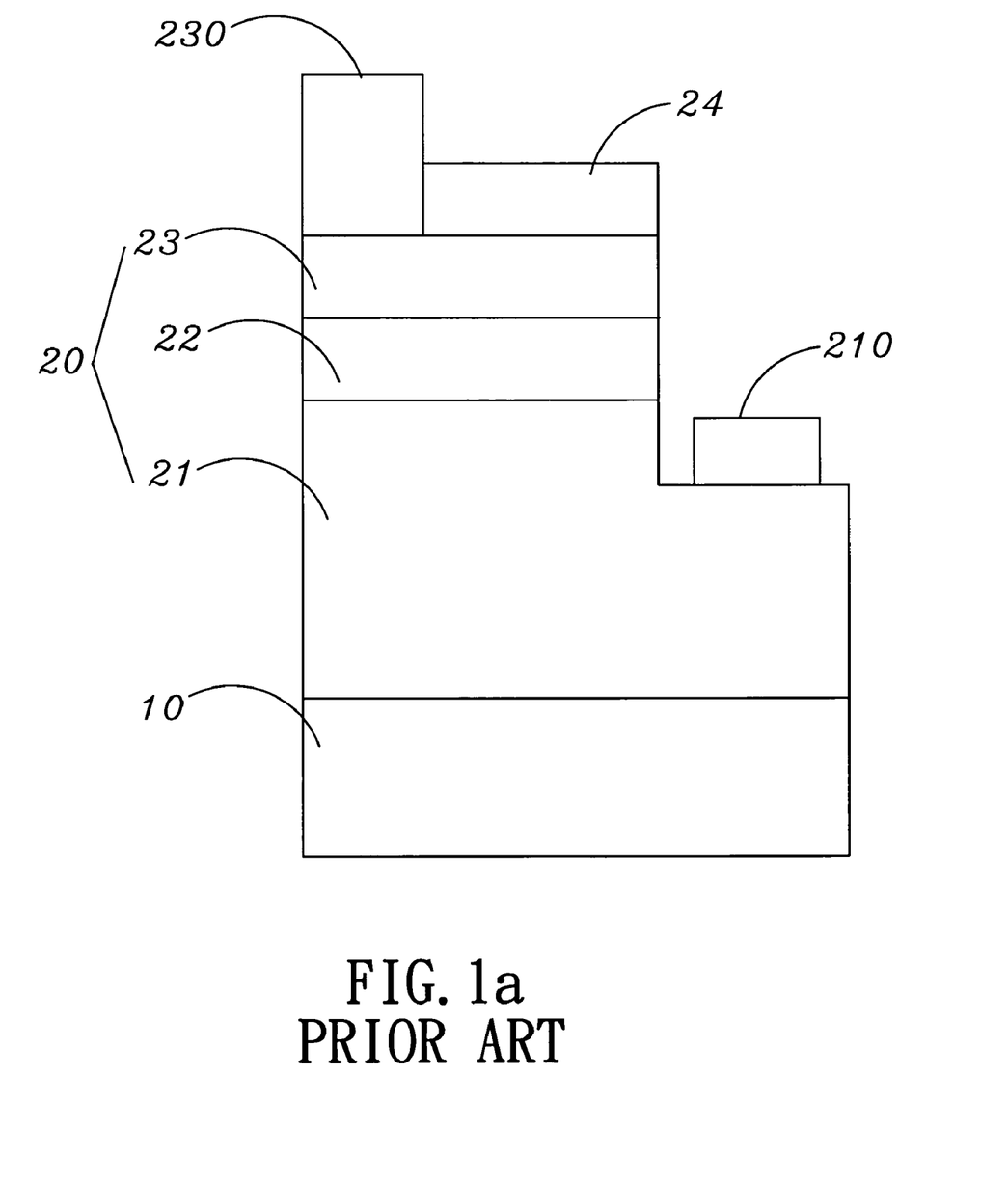
FIG. 1a illustrates a simplified schematic diagram of a conventional light emitting diode device.

The conventional light emitting diode (LED) device, especially InGaN LED device, has the problem of light intensity degradation. As shown in FIG. 1a, the conventional InGaN LED element has an n-type GaN layer 21, an InGaN active layer 22, a transparent conductive layer 24, and a p-type GaN layer 230 which are stacked sequentially in layers on the top face of a sapphire substrate 10. The substrate 10 of conventional light emitting diode device is formed on the bottom of light emitting diode device. The semiconductor layer 20 has an n-type semiconductor layer 21, an active layer 22 and a p-type semiconductor layer 23, wherein the active layer 22 grown between the n-type semiconductor layer 21 and the p-type semiconductor layer 23, an n-pad 210 on the n-type semiconductor layer and at least a p-pad 230 on the p-type semiconductor layer 23; a transparent conductive layer 24 is formed above the p-type semiconductor layer 23.

Figure 1B:
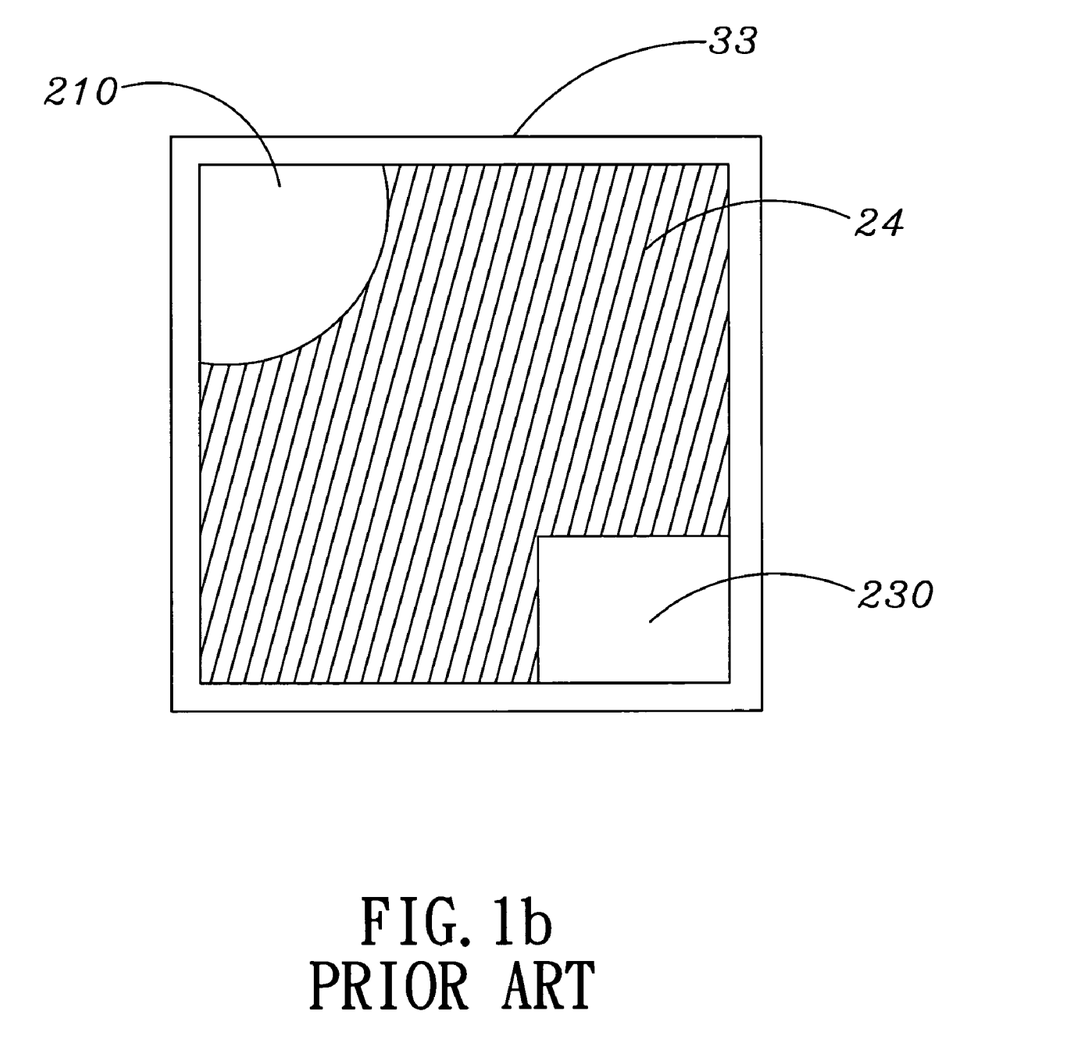
FIG. 1b illustrates top view of conventional light emitting diode device.

Referring to FIGS. 1a and 1b, the conventional light emitting diode device has the problems of low brightness and light intensity degradation. The reason for the low brightness is the low transparency of transparent conductive layer of conventional LED device. The transparency of transparent conductive layer of conventional LED device is only 50% light transmission efficiency.

Even though generally transparent conductive layer of LED device is implemented with high transparency materials for increasing the light transmission efficiency, the LED device only reaches 70% light transmission efficiency. Such low transparency of transparent conductive layer still limit the light brightness of the LED device.

In response to the shortcomings and drawbacks of conventional LED device designs, several alternative approaches have been proposed in order to improve the light transmission efficiency of transparent conductive layer and thus the brightness of LED device produced therefrom.

The present invention provides a metal-oxide layer mixed with transparent conductive layer to increase transmission efficiency of transparent conductive layer.

SUMMARY OF THE INVENTION

The primary objective of the present invention is to provide a light emitting diode device, more particularly a light emitting diode device having a light-transmission conductive layer with high transparency and a patterned transparent conductive layer.

Another objective of the present invention is to provide a manufacturing method of light emitting diode, more particularly a method of manufacturing high brightness light emitting diode device with a light-transmission conductive layer with high transparency and a patterned transparent conductive layer.

Furthermore, the third objective of the present invention is to provide a light emitting diode device with a patterned transparent conductive layer and a patterned reflection layer. As above described, the patterned transparent conductive layer is able to improve the illumination of light emitting, and the patterned reflection layer reflects the light absorbed by the patterned transparent conductive layer.

DETAILED DESCRIPTION OF PREFERRED EMBODIMENT

Figure 2A:
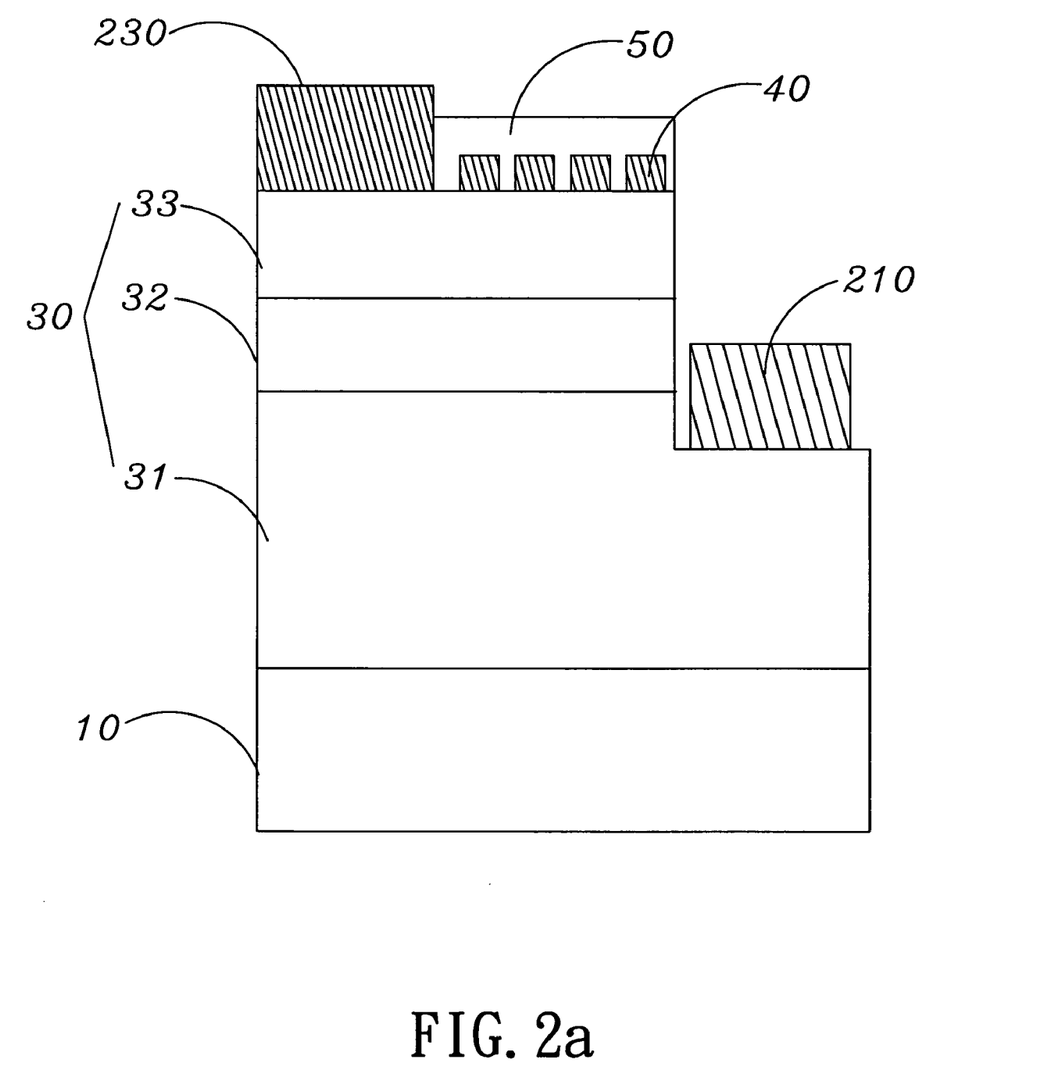
FIG. 2a illustrates a simplified schematic diagram of the present invention of light emitting diode device.

The present invention is directed to a light emitting diode device having a light-transmission conductive layer with high transparency and a patterned transparent conductive layer for increasing light brightness. Referring to FIG. 2a, the LED of present invention, for example an InGaN LED device, comprises a sapphire substrate 10 on the bottom of the light emitting diode device; a semiconductor layer 30 formed above the substrate 10 including an n-type semiconductor 31, an active layer 32 and a p-type semiconductor layers 33, wherein the active layer 32 is formed between the n-type semiconductor layer 32 and p-type semiconductor layer 33; a patterned transparent conductive layer 40 formed on the p-type semiconductor layers 33 and filled with a light-transmission conductive layer 50 so as to increase transmission effectively of the high brightness light emitting diode device; wherein the n-type semiconductor 31 is an N-GaN layer, the p-type semiconductor layer 33 is a P-GaN layer, the active layer 32 is an InGaN/GaN multiple quantum well structure, and the patterned transparent layer 40 is a metal-oxide which is made with at least one metal including Ni, Au, Cr, Ir, Pt, Ag, Ru and Be etc. composed with oxide. The light-transmission layer 50 with high transparency is an oxide layer selected from a group consisting of indium tin oxide (ITO), indium oxide, tin oxide, zinc oxide, and magnesium oxide. Further, the present invention is also directed to the method of manufacturing the high brightness LED device having the light emitting diode device with a light-transmission conductive layer with high transparency and a patterned transparent conductive layer.

In accordance with the present invention to manufacture the LED device, for example, manufacturing an InGaN LED device to high brightness is the embodiment of present invention. The InGaN LED device was grown on a C-plane sapphire substrate 10, made from pure $Al_2O_3$ material. The thickness of the sapphire substrate is about 300 μm. Next, the semiconductor layer 30 is formed on the substrate 10 by MOCVD. Above the semiconductor layer 30, Si ions are implemented in the n-type GaN layer to a 3.5 μm thickness, an active layer 32 is formed with multiple quantum well of InGaN/GaN and then Mg ions are implanted in a p-type GaN. After forming the above described layers, parts of p-type GaN are etched to expose the n-type GaN as an n-GaN layer 31. Forming a p-type and an n-type ohmic contact layers, there are a plural of layers formed above the semiconductor layers. An n-type ohmic contact layer is formed with reactive ion etching technique. Part of semiconductor layers is removed till n-GaN layer. Ti and Al is deposited as n-type contact layer and an n-pad 210. Hereinafter, a transparent conductive layers are made of NiO and Au; then using Ti and Al ions deposited on to form a p-type ohmic contact layer and a p-pad 230.

In order to increase brightness, the TCL of the LED device with low transparency need to be replaced, so the present invention provides a light-transmission conductive layer with ITO, indium-tin-oxide, materials to increase the transparency of the LED device. On the other hand, the ITO of the conductive layer produces a LED device with low ohm property. So the present invention of TCL of LED device is divided into a plural of region and arranged in matrix-lines called a patterned transparent conductive layer 40. On the patterned transparent conductive layer, a light-transmission conductive layer 50 is overlaid.

Figure 2B:
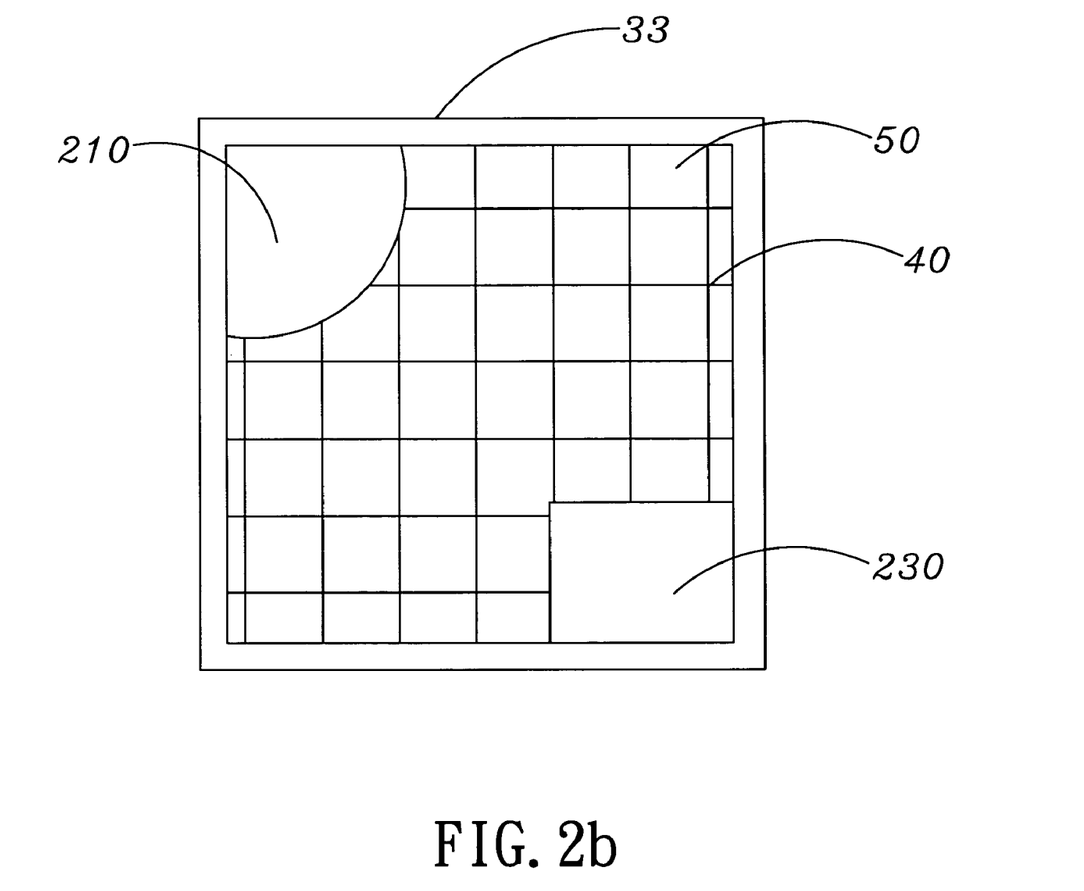
FIG. 2b illustrates a top view of the present invention of a light emitting diode device.
Figure 3A:
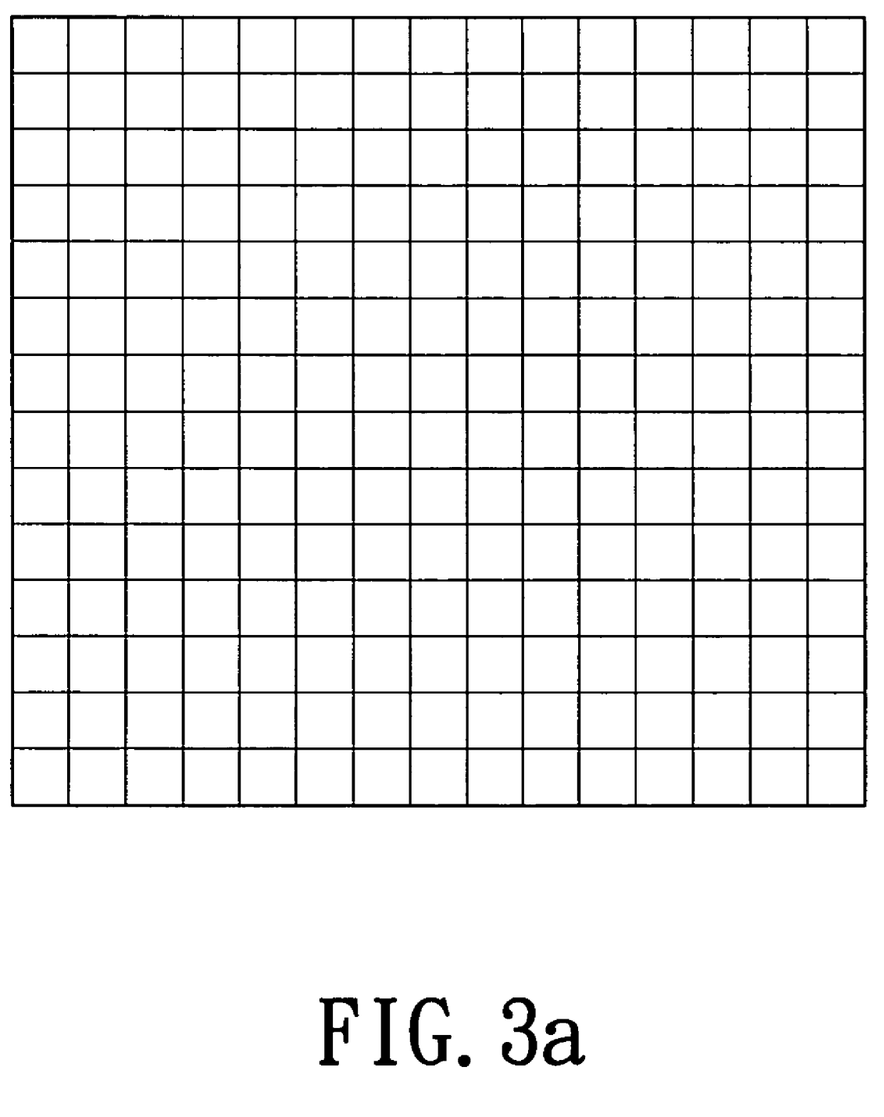
FIG. 3a illustrates a first embodiment of the patterned transparent conductive layer of a light emitting diode device according to the present invention.
Figure 3B:
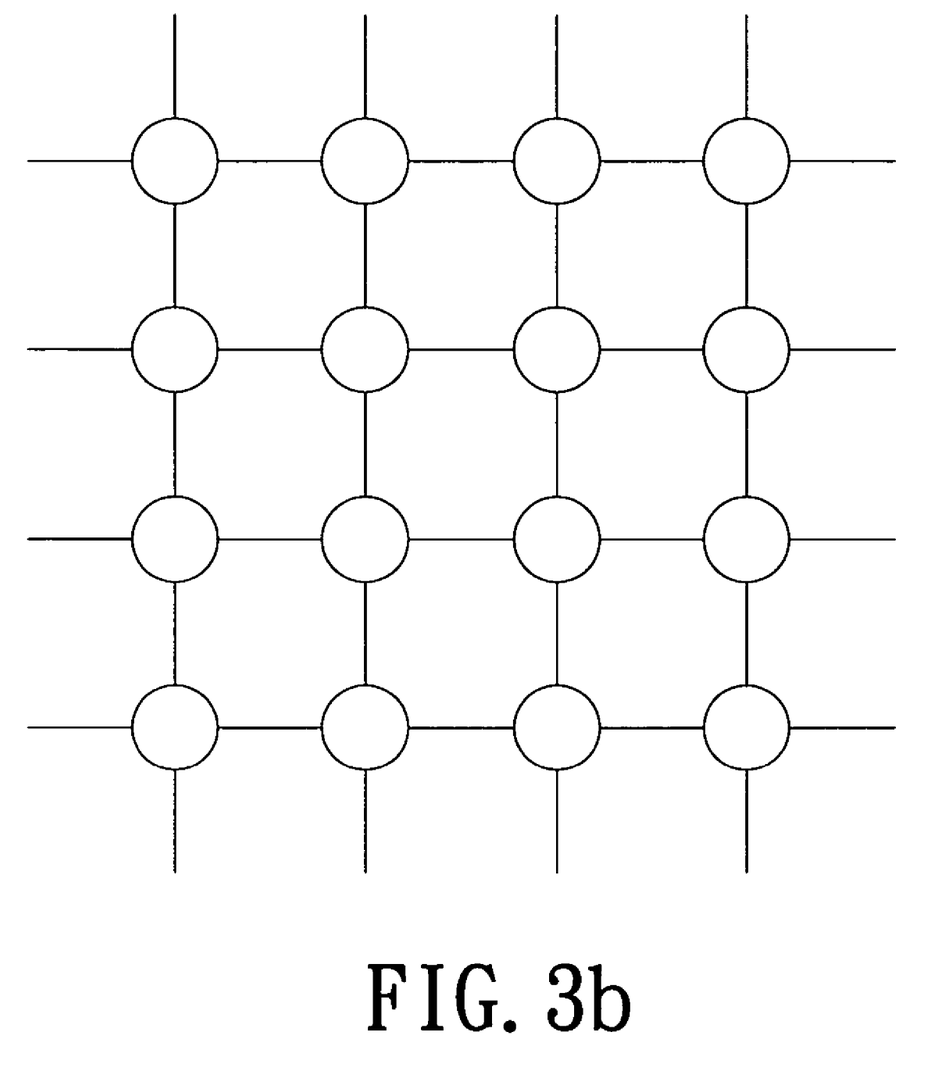
FIG. 3b illustrates a second embodiment of the patterned transparent conductive layer of light emitting diode device according to the present invention.
Figure 3C:
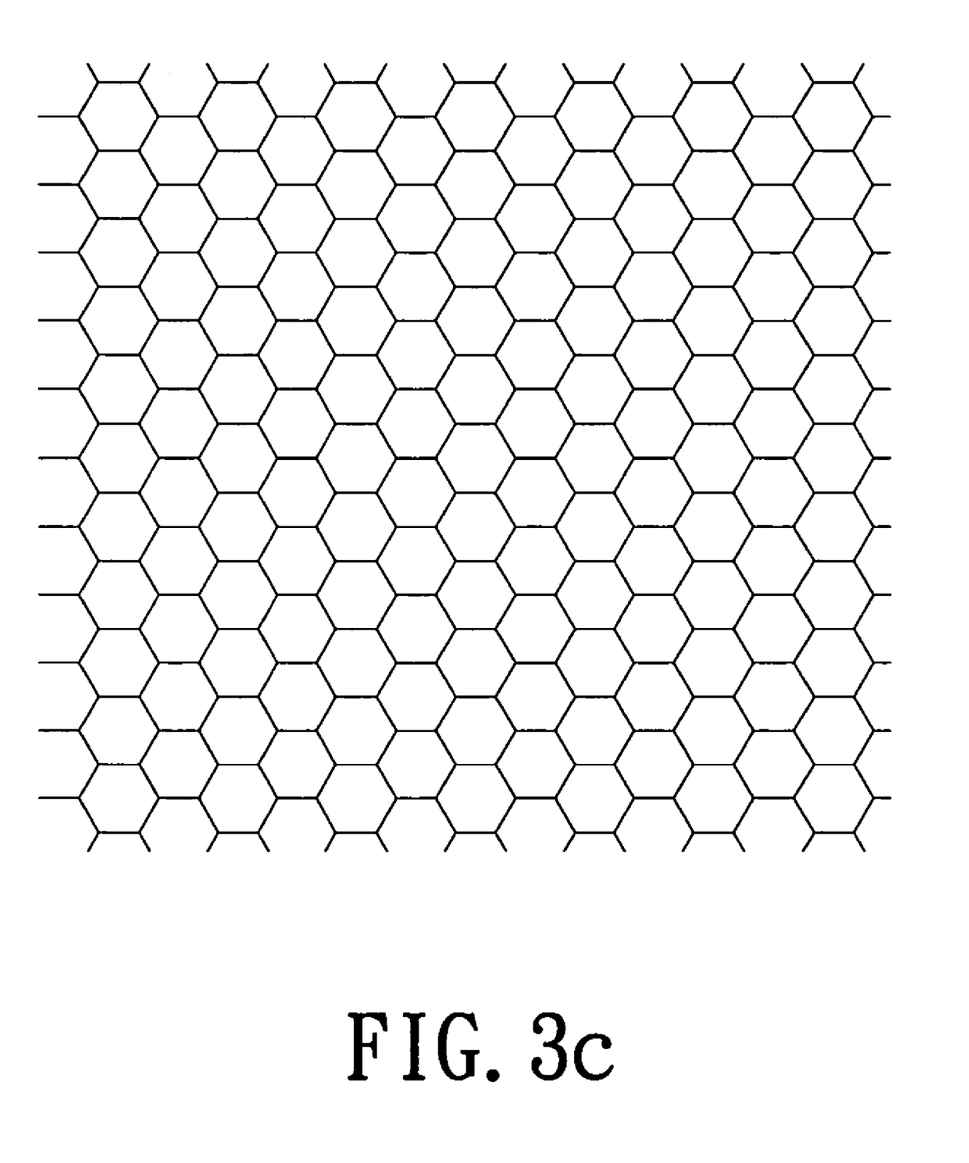
FIG. 3c illustrates a third embodiment of the patterned transparent conductive layer of light emitting diode device according to the present invention.

Referring to FIG. 2b showing the top view of embodiment of present invention, the LED device includes a light-transmission conductive layer 50 and a patterned transparent conductive layer 40. The light-transmission conductive layer 50 with high transparency overlays the patterned transparent conductive layer 40. FIGS. 3a, 3b, 3c show three different shapes of the patterned transparent conductive layer, i.e. a net-shaped, a spot-shaped, or other shape with hollow cuts. The hollow out in each of the embodiments is filled by the light-transmission conductive layer 50 which is an oxide layer selected from the group consisting of indium tin oxide (ITO), indium oxide, tin oxide, indium lead oxide, lead oxide, antimony tin oxide, antimony oxide, antimony zinc oxide, cadmium tin oxide, cadmium oxide, zinc oxide, and magnesium oxide.

In the above embodiments, the high brightness LED device includes a patterned transparent conductive layer 40 and a light-transmission conductive layer 50. The method of manufacturing the LED device comprises: forming a substrate 10 on the bottom of the high brightness light emitting diode device; forming a semiconductor layer 30 above the substrate 10 including a n-type semiconductor, an active layer and a p-type semiconductor layer, wherein the active layer is formed between the n-type semiconductor layer and p-type semiconductor layer; forming a patterned transparent conductive layer 40 on the p-type semiconductor layer, and forming a high transparency conductive layer 50 to overlay the matrix-lines transparent conductive layer.

Assuming the external quantum efficiency of transparent conductive layer of LED device is equal to the LED device with a matrix-lines TCL and an ITO layer with high transparency. The equation is:

$$A\, T_I = (A-a)T_I$$

where a is the spreading area of patterned transparent conductive layer; A is the area of light emitting diode; $T_T$ is the transparency of transparent conductive layer; $T_I$ is the transparency of light-transmission conductive layer.

Arranging above equation, $a = (1 - T_T/T_I)A$.

So if $a < (1 - T_T/T_I)A$ is true, the light transmission efficiency of LED would be increased.

Figure 4:
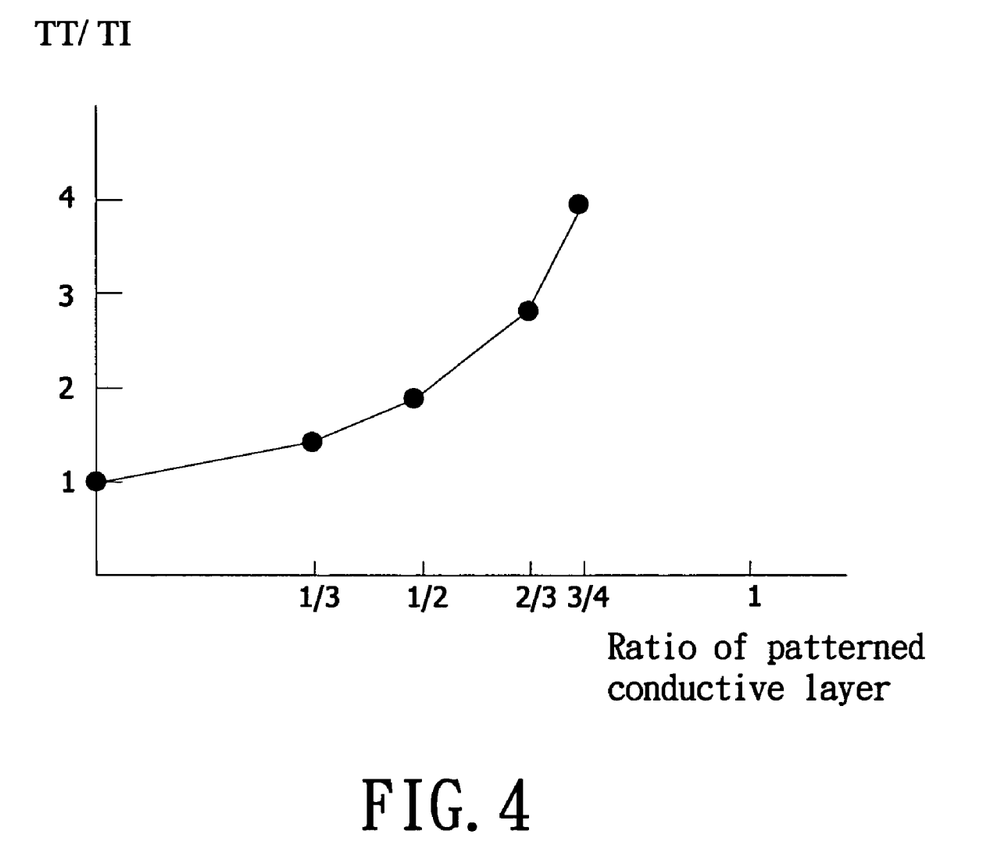
FIG. 4 illustrates the relationship between the transparency of the patterned transparent conductive layer divided to transparency of light-transmission conductive layer and patterned transparent conductive layers area in present invention.

Referring to FIG. 4, shows the relationship between the transparency of patterned transparent conductive layers divided to the transparency of light-transmission conductive layer and the area of patterned transparent conductive layers in present invention for example, $T_T$ is 50%, $T_I$ is 98%, $T_T/T_I = 1.96$ and the area of the LED device of present invention is 300 μm×300 μm, while the area of patterned transparent conductive layer is smaller than 44082 μm², the brightness of LED device can be increased.

Figure 5:
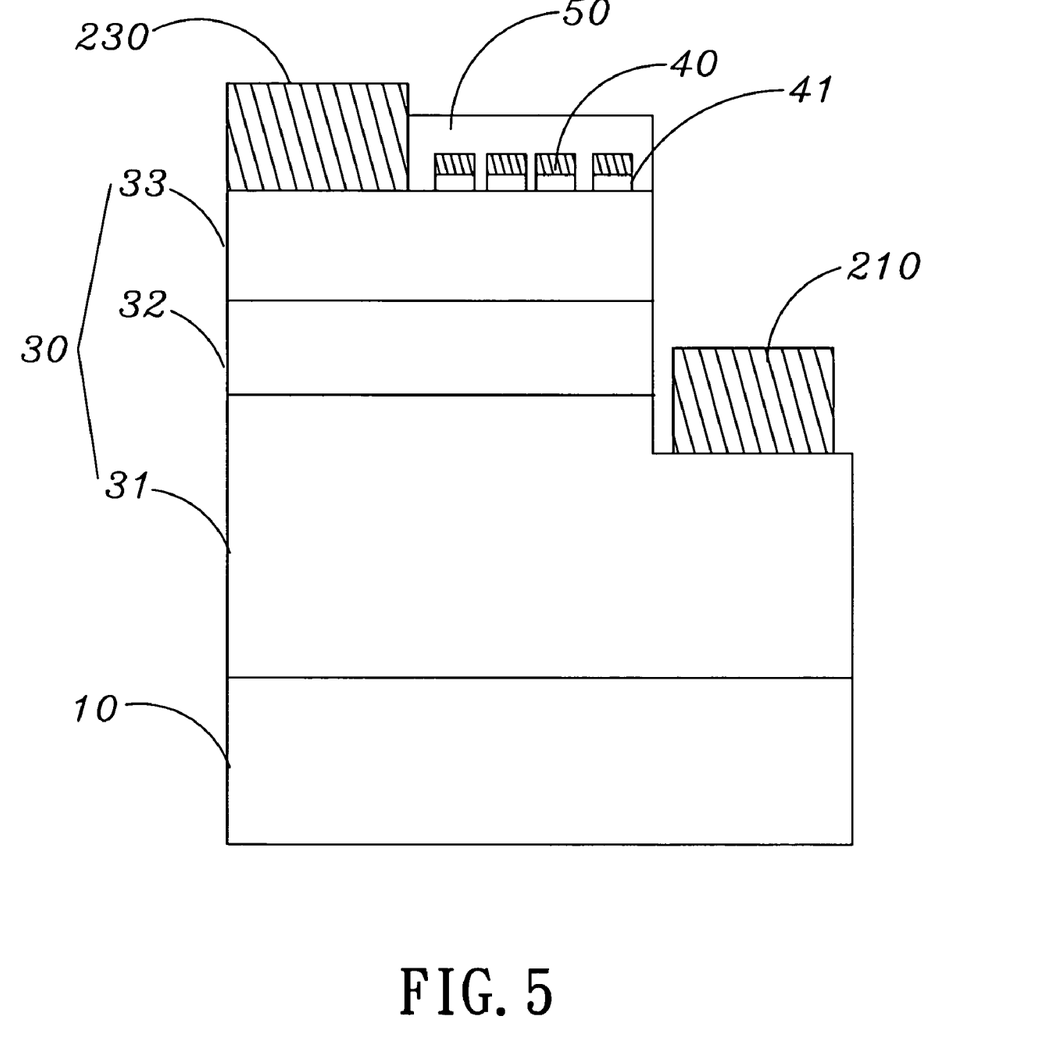
FIG. 5 illustrates a simplified schematic diagram of another embodiment of the light emitting diode device of the present invention.

Referring to FIG. 5, a simplified schematic diagram of another embodiment of light emitting diode device of the present invention, the embodiment of high brightness of the LED device of the present invention comprising: a sapphire substrate 10 on the bottom of the light emitting diode device; a semiconductor layer 30 is formed above the sapphire substrate 10 includes an n-type semiconductor 31 is made of a GaN compound to an n-type GaN layer, an active layer 32 and a p-type semiconductor layer 33 is made of the GaN compound to a p-type GaN layer, wherein the active layer 32 is formed between the n-GaN layer 31 and the p-GaN layer 33; a patterned reflection layer 41 is formed on the p-GaN layers 33; a patterned transparent conductive layer 40 is formed on a patterned reflection layer 41; and a light-transmission conductive layer 50 is formed to overlay the hybrid of the patterned transparent conductive layer 40 and the patterned reflection layer 41; wherein the patterned reflection layer 41 reflects light which is absorbed by the patterned transparent conductive layer 40 so as to increase illumination of the light emitting diode device.

The aforementioned are only exemplarity preferred embodiments of the present invention. The scope of the claims as to be stated below should be accorded to the broadest interpretation so as to encompass various modifications and similar arrangements made without violation of the basic principle and technology of the present invention.

What is claimed is:

1. A light emitting diode device, comprising:
   a substrate deposited on a bottom of the light emitting diode device;
   a semiconductor layer formed above the substrate including an n-type semiconductor layer, an active layer and a p-type semiconductor layer, wherein the active layer is formed between the n-type semiconductor layer and the p-type semiconductor layer;
   a matrix-lines layer formed on the p-type semiconductor layer, wherein the matrix-lines layer is divided into a plurality of regions for providing uniformly spreading current on the light emitting diode device; and
   a light-transmission conductive layer that is an oxide layer filled on the matrix-lines layer so as to effectively increase optical transmission of the light emitting diode device;

wherein an occupied area of the matrix-lines layer follows a formula $$a < (1 - T_T/T_I)A$$

where a is the matrix-lines layer occupied area,
A if the area of the light emitting diode,
$T_T$ is the transparency of the matrix-lines layer, and
$T_I$ is the transparency of the light-transmission conductive layer.

2. The light emitting diode device of claim 1, wherein the substrate is a sapphire substrate.

3. The light emitting diode device of claim 1, wherein the n-type semiconductor is an N-GaN layer.

4. The light emitting diode device of claim 1, wherein the p-type semiconductor layer is a P-GaN layer.

5. The light emitting diode device of claim 1, wherein the active layer is an InGaN/GaN multiple quantum well structure.

6. The light emitting diode device of claim 1, wherein the light-transmission conductive layer is a metal-oxide layer.

7. The light emitting diode device of claim 1, wherein the patterned transparent conductive layer is made of at least one metal selected from a group consisting of Ni, Au, Cr, Ir, Pt, Ag, Ru and Be.

8. The light emitting diode device of claim 1, wherein the light-transmission conductive layer with high transparency is an oxide layer selected from the group consisting of indium tin oxide (ITO), indium oxide, tin oxide, indium lead oxide, lead oxide, antimony tin oxide, antimony oxide, antimony zinc oxide, cadmium tin oxide, cadmium oxide, zinc oxide, and magnesium oxide.

9. A light emitting diode manufacturing method, comprising:
forming a substrate on a bottom of the light emitting diode device;
forming a semiconductor layer above the substrate including an n-type semiconductor layer, an active layer and a p-type semiconductor layer, wherein the active layer is formed between the n-type semiconductor layer and p-type semiconductor layer;
forming a patterned transparent conductive layer on the p-type semiconductor layer; and
forming a light-transmission conductive layer overlaying the patterned transparent conductive layer;
wherein an occupied area of the patterned transparent conductive layer follows a formula $$a < (1 - T_T/T_I)A$$

where a is the patterned transparent conductive layer occupied area,
A is the area of the light emitting diode,
$T_T$ is the transparency of the patterned transparent conductive layer, and
$T_I$ is the transparency of the light-transmission conductive layer.

10. A light emitting diode device, comprising:
a substrate deposited on a bottom of the light emitting diode device;
a semiconductor layer formed above the substrate and including an n-type semiconductor layer, an active layer and a p-type semiconductor layer, wherein the active layer is formed between the n-type semiconductor layer and the p-type semiconductor layer;
a patterned reflection layer formed on the p-type semiconductor layer;
a patterned transparent conductive layer formed on the patterned reflection layer; and
a light-transmission conductive layer overlying a hybrid of the patterned transparent conductive layer and the patterned reflection layer;
wherein the patterned reflection layer reflects light absorbed by the patterned transparent conductive layer so as to increase illumination of the light emitting diode device.

* * * * *